(12) United States Patent
Tsuchida

(10) Patent No.: US 6,815,710 B2
(45) Date of Patent: Nov. 9, 2004

(54) ORGANIC ELECTROLUMINESCENCE UNIT

(75) Inventor: Masami Tsuchida, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 11 days.

(21) Appl. No.: 10/112,680

(22) Filed: Apr. 1, 2002

(65) Prior Publication Data

US 2002/0158262 A1 Oct. 31, 2002

(30) Foreign Application Priority Data

Mar. 30, 2001 (JP) .......................................... 2001-99939
Mar. 30, 2001 (JP) .......................................... 2001-99940

(51) Int. Cl.$^7$ .......................... H01L 33/00; H01L 51/00
(52) U.S. Cl. ............................. 257/40; 257/103; 257/88
(58) Field of Search .............................. 257/40, 103, 88

(56) References Cited

U.S. PATENT DOCUMENTS 6,524,884 B1 * 2/2003 Kim et al. ..................... 438/99

* cited by examiner

Primary Examiner—Jerome Jackson
(74) Attorney, Agent, or Firm—Sughrue Mion, PLLC

(57) ABSTRACT

An active matrix organic electroluminescence unit which is easy to manufacture. The organic electroluminescence unit comprises an organic material layer formed on a surface of the electrode panel, a dielectric layer formed near the organic material layer on the surface of the electrode panel, a metal electrode formed continuous to the surfaces of the organic material layer and the dielectric layer, and having a portion corresponding to the organic material layer functioning as a control electrode, and an organic electroluminescence element formed on the organic material layer. According to a second aspect, the organic electroluminescence unit comprises an insulating film for covering a protruding electrode formed at a position near an intersection with a data line on a scanning line, and formed with data lines and first metal electrodes, respectively, on the surface thereof, a first organic material layer for covering each of these data lines, first metal electrodes and insulating film, an electrode panel, a second organic material layer formed on the surface of the electrode panel, a second metal electrode formed continuous to be in contact with each of the surface of the second organic material layer and each of the first metal electrodes, with a portion corresponding to the second organic material layer functioning as a gate electrode, and an organic electroluminescence element formed on the second organic material layer.

6 Claims, 3 Drawing Sheets

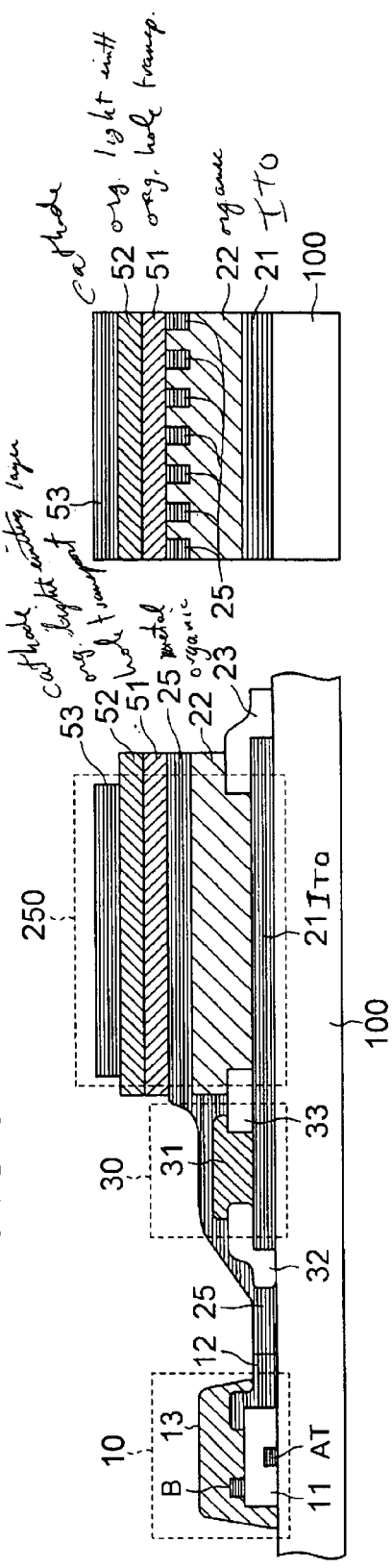
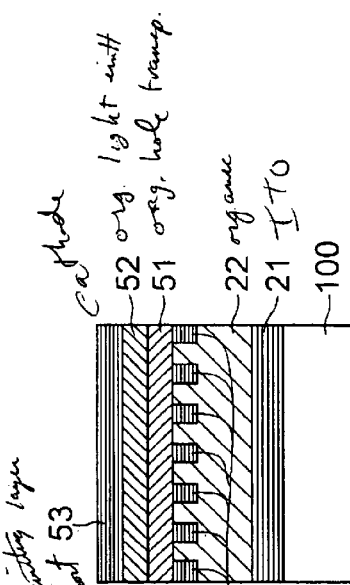
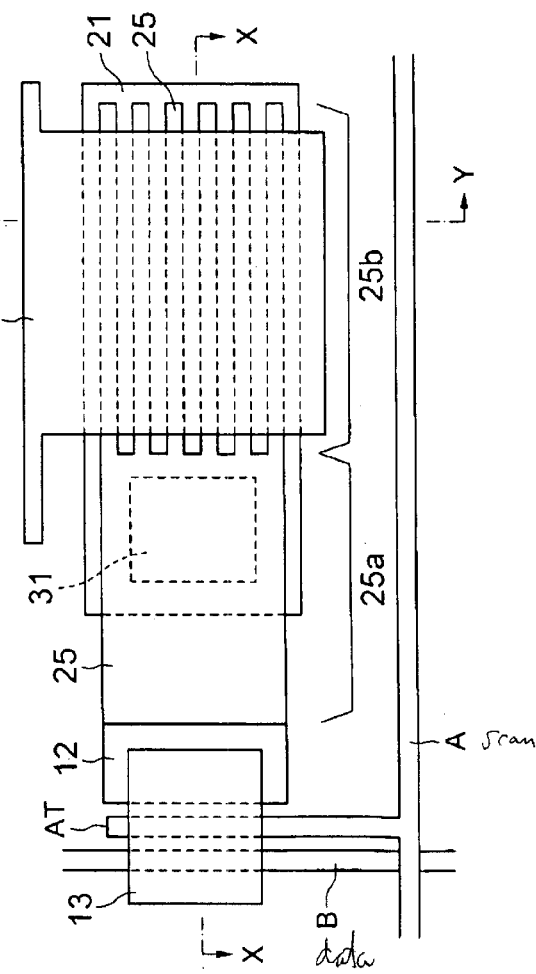

ORGANIC ELECTROLUMINESCENCE UNIT

FIELD OF THE INVENTION

1. Field of the Invention

The present invention relates to an organic electroluminescence unit which functions as each pixel of an active matrix display panel.

2. Description of the Related Art

Currently, the development of matrix displays using a display panel comprised of light emitting elements arranged in the shape of matrix is widely under progress. A light emitting element for use in such a display panel is, for example, an electroluminescence element which uses an organic material as a light emitting layer (hereinafter, referred to as organic EL element). Known as matrix display panel using this organic EL element are a simple matrix display panel and an active matrix display panel. The active matrix display panel is advantageous over the simple matrix display panel in lower power consumption, less crosstalk between pixels, and the like, and is particularly suitable for a large screen display and a high definition display.

FIG. 1 is a diagram illustrating the configuration of such an active matrix display panel.

As illustrated in FIG. 1, the display panel is formed with an anode power supply bus line 16 to which a power supply potential Vc for driving the display panel is applied, and a cathode power supply bus line 17 to which a ground potential GND is applied. The display panel is further formed on one surface thereof with scanning line (metal electrodes) $A_1$–$A_n$ functioning as n horizontal scanning lines, and m data lines $B_1$–$B_m$ intersecting each of the cathode lines. Organic EL units $E_{1,1}$–$E_{n,m}$ functioning as pixels are formed at intersections of these scanning lines $A_1$–$A_n$ and data lines $B_1$–$B_m$.

FIG. 2 is a diagram illustrating an exemplary circuit configuration of an organic EL unit E formed at an intersection of one scanning line A and a data line B.

In FIG. 2, the scanning line A is connected to a gate G of an EFT (Field Effect Transistor) 10 for selecting a scanning line, and the data line B is connected to a drain D of the FET 10. The FET 10 has a source S connected to a gate G of an FET 20 as a light emission driving transistor. The FET 20 has a source S to which a power supply potential Vc is applied through an anode power supply bus line 16, and a capacitor 30 is connected between the gate G and source S of the FET 20. Further, an anode terminal of an organic EL element 50 is connected to a drain of the FET 20. A ground potential GNP is applied to a cathode terminal of the organic EL element 50 through a cathode power supply bus line 17.

Next, description will be made on the operation performed by a light emission driving control circuit (not shown) to drive the organic EL unit E.

First, the light emission driving control circuit alternately applies a scanning pulse sequentially to each of scanning lines $A_1$–$A_n$ of a display panel. Further, the light emission driving control circuit generates each of pixel data pulses $DP_1$–$DP_m$ based on an input video signal for each horizontal scanning line, in synchronism with the timing at which each scanning pulse is applied, and applies data lines $B_1$–$B_m$ with the generated pixel data pulses $DP_1$–$DP_m$. In this event, each of organic EL units E connected to the scanning line A to which the scanning pulse is applied is to be written with pixel data, later described (hereinafter called the scanning selecting state). The EFT 10 of the organic EL unit E in the scanning selecting state turns on in response to the scanning pulse to apply a voltage based on a pixel data pulse DP supplied through the data line B to the gate G of the FET 20 and the capacitor 30, respectively. In response to the voltage applied based on the pixel data pulse DP, the FET 20 turns on to supply a light emission start current based on the power supply potential Vc to the organic EL element 50. The organic EL element 50 emits light in response to the light emission start current. Meanwhile, the capacitor 30 is charged in accordance with the voltage which is applied based on the pixel data pulse DP. The charging operation causes the capacitor 30 to hold a voltage in accordance with the pixel data to perform so-called pixel data writing.

When released from the scanning selecting state, the FET 10 turns off to stop supplying the pixel data pulse DP to the gate G of the FET 20. However, a voltage by the voltage held by the capacitor 30 is continuously applied to the gate G of the FET 20 as mentioned above, so that the FET 20 maintains its on state to continuously supply the light emission start current to the organic EL element 50. In other words, even after the release from the scanning selecting state, the organic EL element 50 continues to emit light.

In this manner, the organic EL unit E functioning each pixel of an active matrix display panel is formed with a transistor for selecting a scanning line (FET 10), a transistor for driving light emission (FET 20), and the capacitor 30 for holding pixel data, in addition to the organic EL element 50 as a light emitting element.

At present, for manufacturing a display panel having the organic EL units E arranged in a matrix form as illustrated in FIG. 1, a TFT (Thin Film Transistor) manufacturing process is used for each of the FETs 10, 20 and capacitor 30. On the other hand, an organic EL manufacturing process is used for manufacturing the organic EL elements 50.

Thus, since the process for manufacturing the FET 10 and 20 is completely different from the process for manufacturing the organic EL elements 50, the overall manufacturing process becomes complicated. In this event, it is contemplated to implement the FETs 10 and 20 with transistors using organic materials. However, the electron mobility of organic materials is lower than a silicon semiconductor, so that if the FET 20 for driving light emission is implemented by an organic transistor, the resulting FET fails to provide a driving current which causes the organic EL element to emit light at a sufficient luminance.

OBJECT AND SUMMARY OF THE INVENTION

The present invention has been made to solve the foregoing problems, and it is an object of the invention to provide an active matrix organic electroluminescence unit which is easy to manufacture.

An active matrix organic electroluminescence unit according to a first aspect of the present invention is an organic electroluminescence unit functioning as a pixel of a display panel, which comprises an electrode panel; an organic material layer formed on the surface of the electrode panel; a dielectric layer formed near the organic material layer on the surface of the electrode panel; a metal electrode formed continuous to the surfaces of the organic material layer and the dielectric layer, and having a portion corresponding to the organic material layer functioning as a control electrode; and an organic electroluminescence element formed on the organic material layer.

An active matrix organic electroluminescence unit according to a second aspect of the present invention is an organic electroluminescence unit which is formed at each of intersections of a plurality of scanning lines and a plurality of data lines intersecting each of the scanning lines on a display panel. The organic electroluminescence unit comprises an insulating film for covering a first gate electrode extending from the scanning line along the data line near each of the intersections, and formed with the data line and a first metal electrode on a surface thereof; a first organic material layer for covering each of the data line, the first metal electrode and the insulating film; an electrode panel; a second organic material layer formed on a surface of the electrode panel; a second metal electrode formed continuous to be in contact with each of the second organic material layer and the first metal, and having a portion corresponding to the second organic material layer functioning as a second gate electrode; and an organic electroluminescence element formed on the organic material layer.

BRIEF DESCRIPTION OF THE DRAWINGS

FIGS. 3A through 3C are diagrams illustrating the structure of the organic EL unit according to the present invention.

DETAILED DESCRIPTION OF THE EMBODIMENT

An embodiment of the present invention will be described in detail with reference to the drawings.

Figure 1:
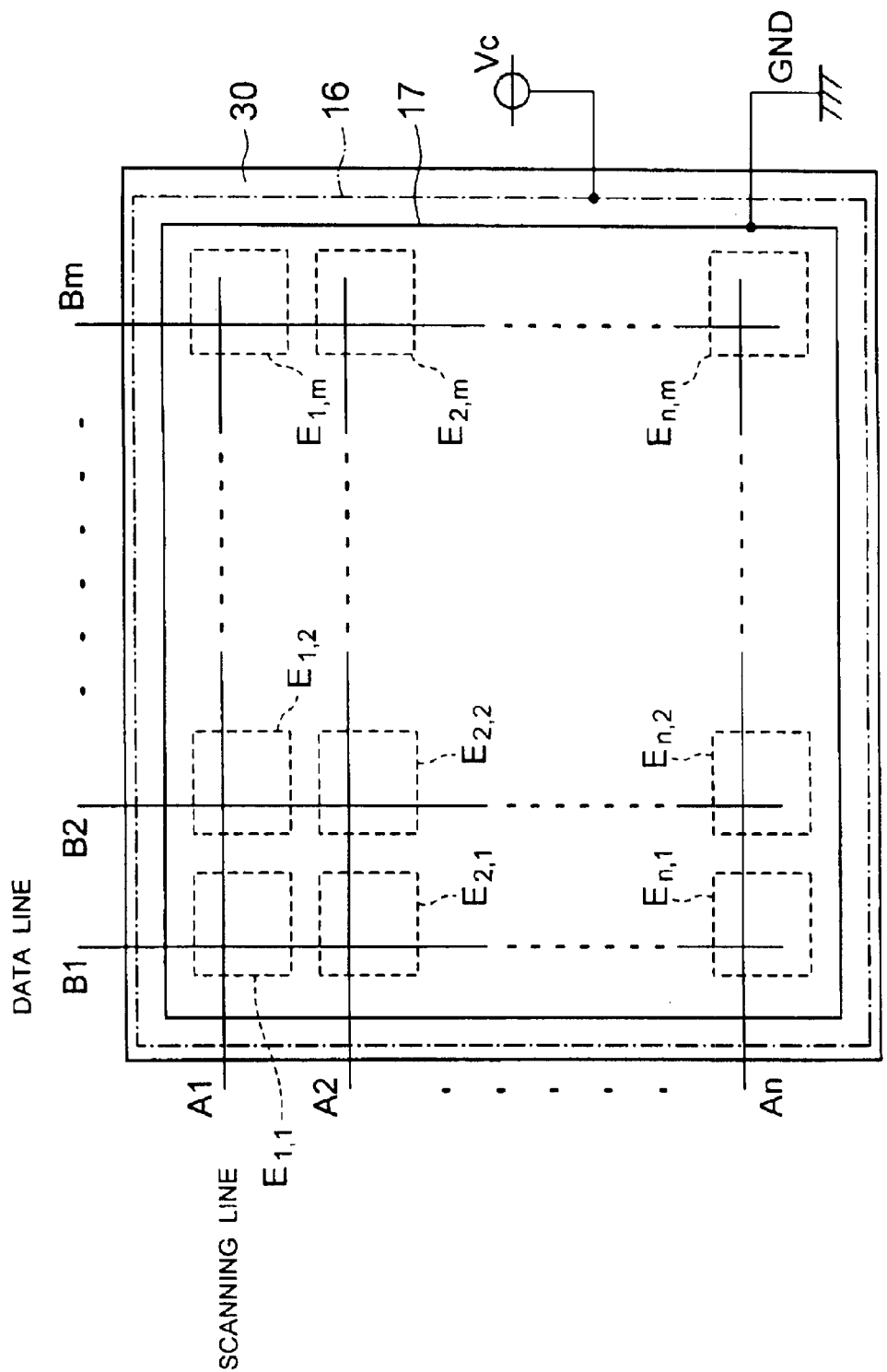
FIG. 1 is a diagram illustrating an example of active matrix display panel.

FIG. 3 is a diagram illustrating the structure of an active matrix organic electroluminescence unit (hereinafter simply called the organic EL unit) according to the present invention. FIG. 3A is a diagram of the organic EL unit viewed from above; FIG. 3B is a cross-sectional view taken along a line IIIB—IIIB in FIG. 3A; and FIG. 3C is a cross-sectional view taken along a line IIIC—IIIC in FIG. 3A. Also, the illustrated organic EL unit corresponds to the organic EL unit E of the active matrix display panel as illustrated in FIG. 1, and its electric circuit diagram is also identical to that illustrated in FIG. 2. Specifically, the function of each of the FET 10 for selecting a scanning line, the capacitor 30 for holding pixel data, the FET 20 for driving light emission, and organic EL element 50, illustrated in FIG. 2, is manufactured in the structure as illustrated in FIGS. 3A–3C.

As illustrated in FIG. 3B, an insulating film 11, a metal electrode 12, and an organic material layer 13 made of polythiophene or the like, by way of example, are formed on a substrate 100 made of an optically transparent glass or the like, for forming the FET 10. Also, a scanning line A of the display panel is provided with a protruding electrode AT, which extends in a direction parallel with a data line B as illustrated in FIG. 3A, at a position near each intersection with the data line B. The insulating film 11 is formed on the substrate 100 so as to cover the protruding electrode AT, and the metal electrode 12 and the data line B are formed on the surface of the insulating film 11, respectively. The metal electrode 12 is formed extending in a direction parallel with the data line B and the protruding electrode AT, as illustrated in FIG. 3A. In this event, the data line B functions as a drain electrode of the FET 10; the metal electrode 12 as a source electrode; and the protruding electrode AT as a gate electrode. Also, as illustrated in FIG. 3B, a channel is formed as the FET 10 in a region sandwiched by the metal electrode 12 and the data line B within the organic material layer 13. In this manner, as a scanning pulse is applied to the protruding electrode AT as the gate electrode of the FET 10 through the scanning line A, the FET 10 turns on, causing a current to flow between the data line B as the drain electrode and the metal electrode 12 as the source electrode. Consequently, in response to the application of the scanning pulse, a voltage corresponding to pixel data supplied through the data line B is applied to the metal electrode 12.

A transparent electrode 21 is also formed on the substrate 100 as illustrated in FIGS. 3A and 3B. The transparent electrode 21 is connected to an anode power supply bus line 16 of the display panel as illustrated in FIG. 1, and a power supply potential Vc for driving the panel is applied through the anode power supply bus line 16. As illustrated in FIG. 3B, a dielectric layer 31, an insulating film 32, an insulating film 33, an organic material layer 22 and an insulating film 23 are formed on the surface of the transparent electrode 21. The insulating films 22, 32 and 33 are provided for preventing unwanted short-circuiting. The dielectric layer 31 is a dielectric material made of a polymer organic material, while the organic material layer 22 is made of an organic material such as polythiophene, by way of example. A common metal electrode 25 is vapor deposited, extending as illustrated in FIGS. 3A and 3B, such that the common metal electrode 25 is embedded within the organic material layer 22 and in contact with each of the surface of the dielectric layer 31 and the metal electrode 12 of the FET 10. The common metal electrode 25 is comprised of a plate-shaped plate electrode 25a and a lattice-shaped lattice electrode 25b, as illustrated in FIG. 3A. In this event, the lattice electrode 25b of the common metal electrode 25 is embedded within the organic material layer 22, as illustrated in FIG. 3C. With the foregoing configuration, a gate of the organic EL transistor 250, later described, is implemented. On the other hand, the plate electrode 25a of the common metal electrode 25 is formed to extend into contact with the surface of the dielectric layer 31, and also into contact with the metal electrode 12 of the FET 10, as illustrated in FIG. 3B. On the surface of the organic material layer 22, each of an organic hole transportation layer 51 and an organic light emitting layer 52, acting as the organic EL element 50, is laminated as illustrated in FIGS. 3B and 3C. Further, a cathode 53 is vapor deposited on the surface of the organic light emitting layer 52. The cathode 53 is connected to a cathode power supply bus line 17 of the display panel as illustrated in FIG. 1, and a ground potential GND is applied through the cathode power supply bus line 17.

Figure 2:
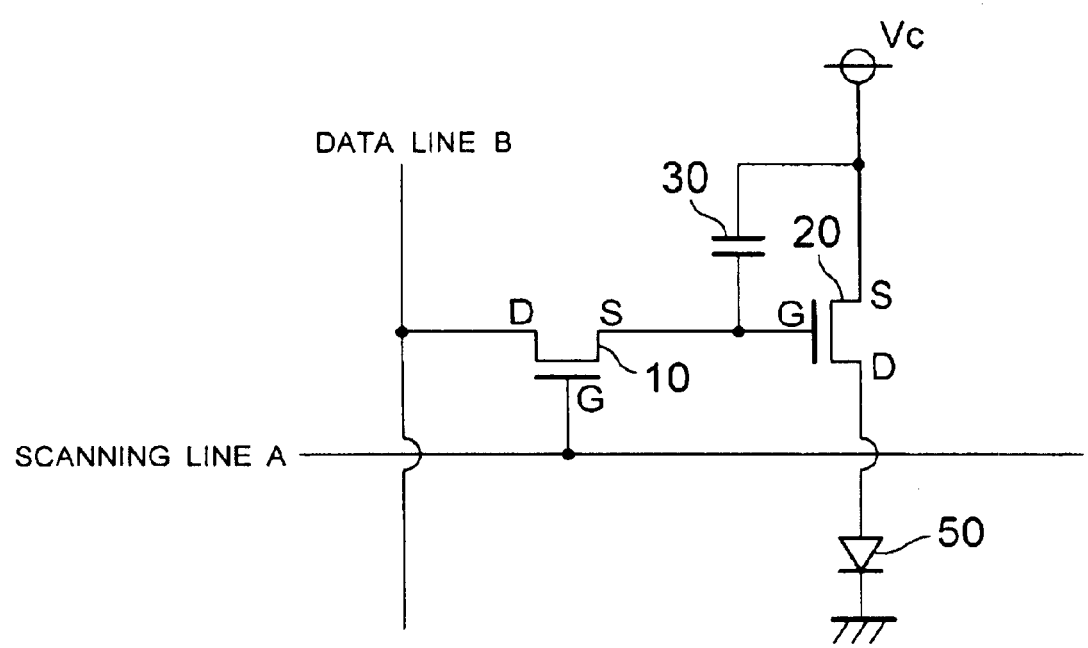
FIG. 2 is a diagram illustrating an electric circuit diagram of an organic EL unit E which functions as each pixel of the active matrix display panel.

Here, a capacitor 30 as illustrated in FIG. 2 is formed by the dielectric layer 31, and the plate electrode 25a of the common metal electrode 25 and the transparent electrode 21 which sandwich the dielectric layer 31 as illustrated in FIG. 3B. Specifically, the plate electrode 25a of the common metal electrode 25 functions as an electrode at one end of the capacitor 30, while the transparent electrode 21 functions as an electrode at the other end of the capacitor 30.

Also, as illustrated in FIG. 3B, the structure comprised of the transparent electrode 21, organic material layer 22, lattice electrode 25b of the common metal electrode 25, organic hole transportation layer 51, organic light emitting layer 52 and cathode 53 forms the organic EL transistor 250 which has functions of both the FET 20 for driving light emission and the organic EL element 50, illustrated in FIG. 2. In this event, the transparent electrode 21 functions as a source electrode of the transistor for driving light emission, while the lattice electrode 25b of the common metal electrode 25 functions as a gate electrode of the transistor for driving light emission. Also, the cathode 53 is in double use as an electrode on the drain side of the transistor for driving light emission, and a cathode terminal of the organic EL element.

In the organic EL transistor 250 having the structure as described above, a driving current in accordance with a voltage applied to the common metal electrode 25 flows between the transparent electrode 21 and the cathode 53 through the lattice of the lattice electrode 25b of the common metal electrode 25, as illustrated in FIGS. 3A and 3C. In this event, the organic light emitting layer 52 emits light at a luminance corresponding to the driving current.

In the foregoing manner, the organic EL transistor 250 employs the structure which causes a current to flow between the transparent electrode 21 and the cathode 53, i.e., in the vertical direction with respect to the substrate 100, as illustrated in FIG. 3B. It is therefore possible to increase an area through which electrons, which move between the transparent electrode 21 and the cathode 53, pass, i.e., a so-called channel area, and to reduce their moving distance. Thus, even a transistor made of an organic material having a lower electron mobility than a silicon semiconductor can provide a driving current which enables an organic EL element to emit light at a sufficient luminance. Therefore, according to the organic EL unit illustrated in FIGS. 3A–3C, the transistor for driving light emission as well as the organic EL element 50 can be made of an organic material.

Further, in the organic EL unit, the dielectric layer 31 and the organic material layer 22 are formed adjacent to each other on the surface of the transparent electrode 21. Then, a control electrode (gate electrode) of the transistor for driving light emission is implemented by embedding the lattice electrode 25b of the common metal electrode 25 in the organic material layer 22, and the capacitor 30 is implemented by forming the plate electrode 25a of the common metal electrode 25 on the surface of the dielectric layer 31. Therefore, the implementation of the gate of the transistor for driving light emission, and the formation of the capacitor for holding pixel data are accomplished simultaneously through a single vapor deposition process for the common metal electrode 25.

Further, as described above, in the organic EL unit according to the present invention, the transistor for driving light emission can be made of an organic material by supplying the driving current between the transparent electrode 21 and the cathode 53 as illustrated in FIG. 3B, i.e., by employing a so-called vertical structure. Further, in the present invention, the protruding electrode is provided, extending in the direction parallel with the data line, near each of data lines on the scanning line. This protruding electrode is used as the gate electrode, while the data line B is used as the drain electrode (or the source electrode) as it is. Thus, a transistor in horizontal structure is employed as the transistor for selecting a scanning line. In other words, a portion of the data line B functions, as it is, as the drain electrode (or the source electrode) of the transistor for selecting a scanning line.

According to the present invention, therefore, it is possible to readily manufacture the organic EL unit which includes the transistor for selecting a scanning line, responsible for driving the active matrix, and the transistor for driving light emission.

In the foregoing embodiment, an SIT (Static induction transistor) structure is employed as the structure of the transistor for driving light emission, wherein the gate is formed by embedding the lattice electrode of the common metal electrode 25 in the organic material layer 22, as illustrated in FIG. 3C. The present invention, however, is not limited to this structure. For example, a transistor in bipolar structure may be employed as the transistor for driving light emission, wherein an n-type organic material layer made of an n-type organic material is sandwiched between p-type organic material layers made of a p-type organic material in the vertical direction to laminate these layers. Alternatively, a thyristor structure may be employed. In essence, any other transistor structure may be employed for the transistor for driving light emission as long as a transistor in the vertical structure is employed so that the current flows in the vertical direction with respect to the substrate 100 in order to increase the channel area and hence improve the current driving capability. In this event, as illustrated in FIG. 3B, the transistor for driving light emission and the organic EL element may be integrally formed such that they share their electrodes, or both components may be separately formed and stacked in the vertical direction.

Also, the foregoing embodiment employs a transistor of a so-called horizontal structure for the FET 10, which is a transistor for selecting a scanning line, wherein a current flows between the data line B and the metal electrode 12, as illustrated in FIG. 3B. However, in regard to this transistor for selecting a scanning line, a transistor of the vertical structure may be employed as is the case with the transistor for driving light emission.

As is apparent from the foregoing, the present invention employs a transistor in vertical structure as the transistor for driving light emission, thereby making it possible to make the transistor for driving light emission as well as the organic EL element of an organic material.

Further, according to one aspect of the present invention, the dielectric layer and the organic material layer are formed adjacent to each other on the surface of the electrode panel. Then, the lattice electrode of the common metal electrode is embedded in the organic material layer so that they are brought into contact with each other to form the gate of the transistor for driving light emission, and the plate electrode of the common metal electrode is formed on the surface of the dielectric layer to form the capacitor for holding pixel data. Therefore, the implementation of the gate of the transistor for driving light emission, and the formation of the capacitor for holding pixel data are accomplished simultaneously through a single vapor deposition process for the common metal electrode.

Thus, according to the present invention, it is possible to readily manufacture the organic EL unit which includes transistors for driving the active matrix, and capacitors.

Further, according to another aspect of the present invention, a transistor in horizontal structure is employed for the transistor for selecting a scanning line, which has a gate electrode formed by a protruding electrode provided near an intersection with each data line on a scanning line, and a drain electrode (or a source electrode) formed by a data line as it is.

Thus, according to the present invention, it is possible to readily manufacture the organic EL unit which includes transistors for selecting a scanning line, responsible for driving the active matrix, and transistors for driving light emission.

This application is based on Japanese Patent Applications Nos. 2001-99939 and 2001-99940 which are herein incorporated by reference.

What is claimed is:

1. An organic electroluminescence unit functioning as a pixel of a display panel, comprising:

an electrode panel;

an organic material layer formed on a surface of said electrode panel;

a dielectric layer formed near said organic material layer on the surface of said electrode panel;

a metal electrode formed continuous to the surfaces of said organic material layer and said dielectric layer, said metal electrode having a portion formed on said organic material layer functioning as a control electrode; and an organic electroluminescence element formed on said organic material layer.

2. An organic electroluminescence unit according to claim 1, wherein said control electrode is a lattice-shaped electrode.

3. An organic electroluminescence unit according to claim 1, wherein said control electrode is embedded in said organic material layer.

4. An organic electroluminescence unit according to claim 1, wherein:

said display panel has a plurality of scanning lines, and a plurality of data lines intersecting each of said scanning lines, and said organic electroluminescence unit further comprises a transistor for applying said metal electrode with a voltage applied to said data line in accordance with a voltage applied to said scanning line.

5. An organic electroluminescence unit formed at each of intersections of a plurality of scanning lines and a plurality of data lines on a display panel, said organic electroluminescence unit comprising:

an insulating film for covering a first gate electrode extending from said scanning line along said data line near each of said intersections, said insulating film formed with said data line and a first metal electrode on a surface thereof;

a first organic material layer for covering each of said data line, said first metal electrode and said insulating film;

an electrode panel;

a second organic material layer formed on a surface of said electrode panel;

a second metal electrode formed continuous to be in contact with each of said second organic material layer and said first metal electrode, said second metal electrode having a portion formed on said second organic material layer functioning as a second gate electrode; and an organic electroluminescence element formed over said second organic material layer.

6. An organic electroluminescence unit according to claim 5, wherein said first metal electrode is formed extending in parallel with said data lines.

* * * * *